United States Patent
Lucas et al.

(10) Patent No.: US 7,287,708 B2
(45) Date of Patent: Oct. 30, 2007

(54) COOLING SYSTEM CONTROL WITH CLUSTERED MANAGEMENT SERVICES

(75) Inventors: Gregg S Lucas, Tucson, AZ (US); Robert A Kubo, Tucson, AZ (US); Brian J Cagno, Tucson, AZ (US); Matthew D Bomhoff, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 10/988,370

(22) Filed: Nov. 12, 2004

(65) Prior Publication Data

US 2006/0101833 A1 May 18, 2006

(51) Int. Cl.
*F24F 7/00* (2006.01)
*F25D 23/12* (2006.01)
*H05K 7/20* (2006.01)

(52) U.S. Cl. ............... 236/49.3; 62/259.2; 361/688

(58) Field of Classification Search ............... 236/49.3; 62/186, 259.2; 361/688, 690, 692, 694, 695
See application file for complete search history.

(56) References Cited

U.S. PATENT DOCUMENTS

| | | | |
|---|---|---|---|
| 4,426,960 A * | 1/1984 | Hart | 123/41.49 |
| 5,668,532 A | 9/1997 | Beer et al. | |
| 5,949,646 A | 9/1999 | Lee et al. | |
| 5,966,510 A | 10/1999 | Carbonneau | |
| 6,101,459 A | 8/2000 | Tavallaei et al. | |
| 6,345,369 B1 | 2/2002 | Kitamorn et al. | |
| 6,418,539 B1 | 7/2002 | Walker | |
| 6,564,571 B2 | 5/2003 | Feeney | |
| 6,654,241 B2 | 11/2003 | Hillyard et al. | |
| 2004/0001311 A1 | 1/2004 | Doblar et al. | |
| 2006/0138247 A1* | 6/2006 | Shen et al. | 236/49.3 |

OTHER PUBLICATIONS

IBM (1994) Technical Disclosure Bulletin 37:217.
IBM (1995) Technical Disclosure Bulletin 38:175.

\* cited by examiner

*Primary Examiner*—Marc Norman
(74) *Attorney, Agent, or Firm*—Dan Shifrin

(57) ABSTRACT

A data processing unit including a first active cooling device configured to respond to a first control signal and a second active cooling device configured to respond to a second control signal. The control signals may be any type of control signal suitable to control the operation of the first and second active cooling devices. The data processing unit also includes a first control function selectively capable of providing the first control signal and/or the second control signal, and a second control function selectively capable of providing the first control signal and/or the second control signal. Logic associated with the first and second control functions is included to determine which of the control functions will provide which control signal at a specific time. Logic and/or switching or isolation apparatus is also included to prevent both the first and second control functions from attempting to provide one of the control signals simultaneously.

36 Claims, 2 Drawing Sheets

COOLING SYSTEM CONTROL WITH CLUSTERED MANAGEMENT SERVICES

TECHNICAL FIELD

The present invention relates to a method, system and article of manufacture for environmental control, in particular redundant cooling system control in high availability data processing systems with clustered management services.

BACKGROUND ART

The electronic and electromagnetic components of a computer system require a stable environment to ensure proper operation. The components within a computer system generate a great deal of heat during use. Absent proper environmental control, including active heat dissipation, components can and will overheat, causing erratic behavior, malfunctions, or total component failure.

The computer system market demands that state of the art systems have extremely high reliability and availability. Thus, systems are typically designed with one or more cooling components. The cooling components can consist of passive heat sinks and/or fans or blowers designed to move air over the components. Simple, active cooling can be accomplished by placing a single fan at an opening to an apparatus enclosure and blowing air in or out of the enclosure on a continuous basis. Naturally, the failure of such a fan will result in overheating leading to component failure.

More sophisticated cooling systems feature various sensors for detecting environmental and power supply problems and providing appropriate error messages to inform users of problems upon occurrence. In addition, more sophisticated systems will include redundant components, for example redundant fans or power supplies, so that the failure of a single component does not necessarily result in unacceptable environmental conditions within an enclosure.

For example, Walker, U.S. Pat. No. 6,418,539, CONTINUOUSLY AVAILABLE COMPUTER MEMORY SYSTEMS, teaches a memory storage system having a logical controller subsystem interfaced with a power supply subsystem and a fan subsystem. In addition, each of the subsystems is reproduced in triplicate. Thus, if the primary fan subsystem fails, a secondary fan subsystem takes over cooling operations. Similarly, if the primary controller fails, the duplicate backup controller takes over operations previously performed by the primary controller.

Simple redundancy systems typically do not have the autonomic capability to compensate for the elective withdrawal of a select component from the overall system. For example, a simple redundancy system may not provide for backup control of a cooling system when a primary controller is electively removed for routine maintenance, replacement or for another purpose. Also, a simple redundancy system may not detect and return control to the primary controller when it is returned to the system after the elective withdrawal.

In addition, simple redundancy systems such as described in Walker require that the backup subsystems be functional upon failure of the primary subsystem. This reliance can be problematic since dormant backup subsystems are typically not in use throughout the period of time prior to failure of the primary subsystem, thus, there is no guarantee to the system operator that the backup will perform as required at the time it is called upon.

In addition, in some system configurations it is not possible to implement designs where the failure of a component can be completely compensated for by simply providing a redundant component that has its own independent control functions. Certain components are required to share common independent control functions. In such a setting, it is required that a failure in one control function or the removal of the second control function not negatively impact the shared functionality.

The present invention is directed to overcoming one or more of the problems discussed above.

SUMMARY OF THE INVENTION

The need in the art is met by a data processing unit including a first active cooling device configured to respond to a first control signal and a second active cooling device configured to respond to a second control signal. The active cooling devices may be fans, blowers, fluid heat exchange devices, peltier modules, or other active cooling devices known in the computing arts. The control signals may be any type of control signal suitable to control the operation of the first and second active cooling devices. If the active cooling devices are fans, a pulse width modulation (PWM) signal is particularly well suited for use as a control signal. The data processing unit also includes a first control function selectively capable of providing the first control signal and/or the second control signal, and a second control function selectively capable of providing the first control signal and/or the second control signal. Logic associated with the first and second control functions is included to determine which of the control functions will provide which control signal at a specific time. Logic and/or switching or isolation apparatus is also included to prevent both the first and second control functions from attempting to provide one of the control signals simultaneously.

The control functions may be any type of control apparatus, software, hardware, or logical device known in the computing arts which is suitable for controlling a cooling device. A SCSI enclosure services (SES) control function is particularly well suited for implementation with the present invention.

The data processing unit may further include apparatus or logic for determining if one of the first or second control functions has either been electively withdrawn from the data processing unit or has failed. In addition, the data processing unit will include logic or apparatus for transferring to the control function remaining after an elective withdrawal or failure the responsibility for providing any control signal previously provided by the withdrawn or failed control function.

Preferably, the data processing unit will also include logic or apparatus to determine if the withdrawn or failed control function has been returned to the data processing unit or repaired. Furthermore, logic and/or apparatus will be associated with the data processing unit for restoring to the previously withdrawn or presently repaired control function responsibility for providing any control signals previously provided by the withdrawn or failed control function.

Preferably, the first and second control functions will communicate with each other and will each include status tables having indicators capable of showing which control function is responsible for providing each of the first and second control signals. Typically, each control function will be aware of the other control function's status table by employing a periodic scanloop over the communication line connecting the control functions.

The data processing unit may include a first power supply operatively associated with the first active cooling device and a second power supply operatively associated with the second active cooling device. In such an implementation, it is preferable that a first and second power control module be associated with each respective power supply, wherein the first and second power control modules will receive the first and second control signals and condition the first and second control signals for transmission to the first and second active cooling devices.

In addition, the data processing unit may include a first and second sensor operatively associated with the first and second active cooling devices, the sensors being configured to provide feedback signals regarding the status of the active cooling devices to each of the control functions.

Although described above with respect to an apparatus, the need in the art may also be met with a method of controlling the environment within a data processing unit, an article of manufacture containing instructions for controlling the environment within a data processing unit, or a method for deploying computing infrastructure comprising integrating computer readable code into a computing system for controlling the environment within a data processing unit.

DETAILED DESCRIPTION OF THE PREFERRED EMBODIMENT

Figure 1:
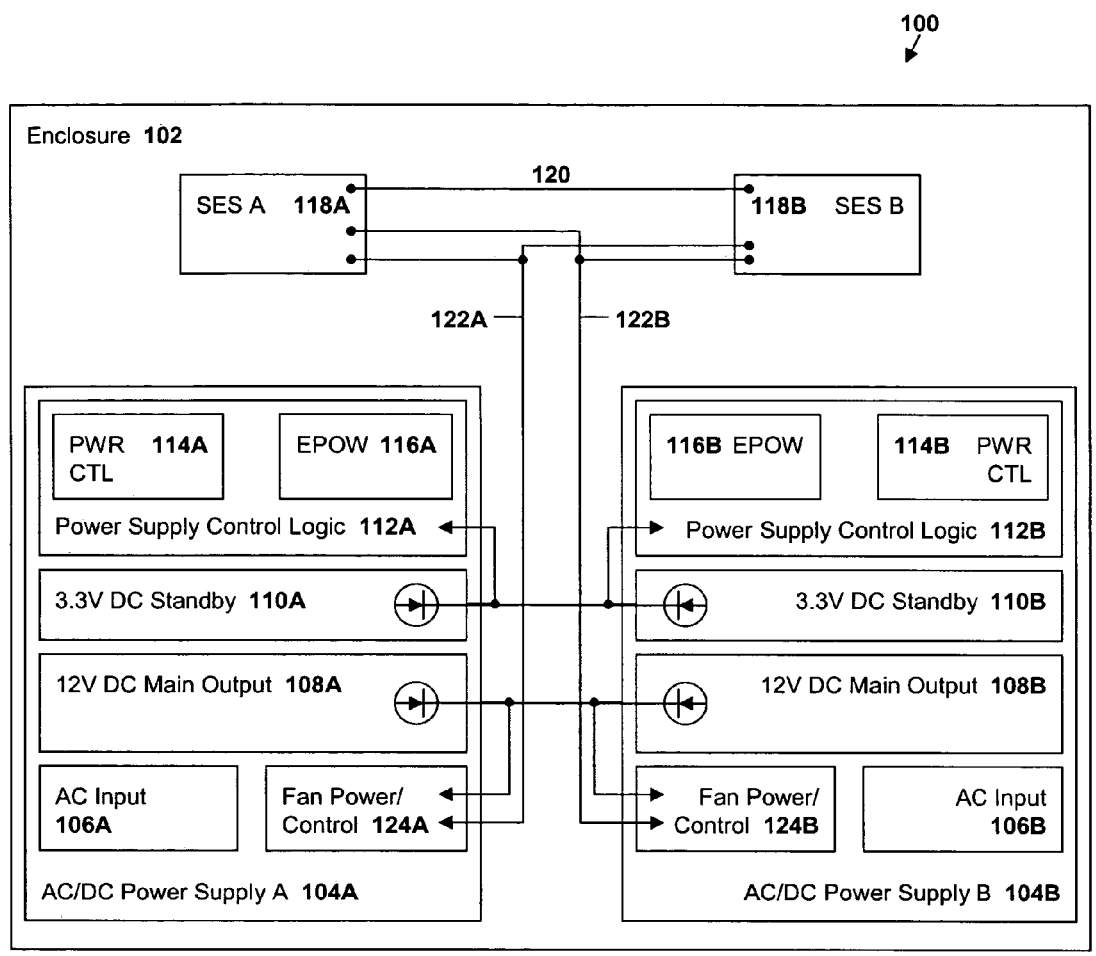
FIG. 1 is a schematic diagram of an implementation of the present invention featuring two control functions and two power supplies.

FIG. 1 schematically represents a data processing unit 100 having all internal components and elements of the data processing unit 100 contained within an enclosure 102. The data processing unit 100 may be a computer, server, storage device, or similar hardware from a data processing system. The data processing unit 100 includes two power supplies; AC/DC power supply A 104A and AC/DC power supply B 104B. Each AC/DC power supply 104A, 104B functions to convert AC current such as is available in an office, data processing center, or home, to the various DC voltages necessary to power the data processing components. Typically, an AC/DC power supply 104A, 104B will have an AC input 106A, 106B and one or more DC outputs 108A, 108B, 110A, 110B.

Each AC/DC power supply 104A, 104B may also include power supply control logic 112A, 112B. The power supply control logic 112A, 112B may include control logic 114A, 114B and an input power state monitoring and reporting logic 116A, 116B.

Although the present invention is described herein in terms of an embodiment having two power supplies and, as discussed below, two active cooling devices and two control functions, the invention is not limited to embodiments having only duplicate redundant components. The invention may be scaled to triple or further redundancy as may be suitable for any given implementation. The description of duplicate redundancy herein is utilized to simplify the following technical description and is not intended to limit the scope of the invention in any way.

The simplified embodiment shown in FIG. 1 also includes two control functions 118A, 118B. The control functions 118A, 118B may be implemented with any type of logical device control functionality known in the computing arts, however, implementation of the present invention is particularly well suited for implementation with a SCSI enclosure services (SES) control function.

A typical SES control function monitors many environmental parameters associated with a data processing unit 100 enclosure 102. For example, an SES control function may receive input from temperature sensors, access door latch solenoids, power supplies, status and availability monitors, fan speed tachometers, or Hall effect sensors. With respect to the present invention, the SES control functions 118A, 118B are preferably implemented with outputs for pulse width modulation (PWM) control of active cooling device speeds and inputs for fan speed sensors.

Control Function 118A and control function 118B communicate with each other via an inter-control function communication line 120. The inter-control function communication line 120 may be any type of electronic or optical digital communication link. The control function 118A, 118B control signals 122A, 122B which communicate with each power supply 104A, 104B and with the other control function. In a preferred embodiment, the control signal 122A, 122B is a PWM cooling device control signal which is also conditioned for output to one or more active cooling devices by a fan power control module 124A, 124B associated with each power supply 104A, 104B.

Figures 2, 3:
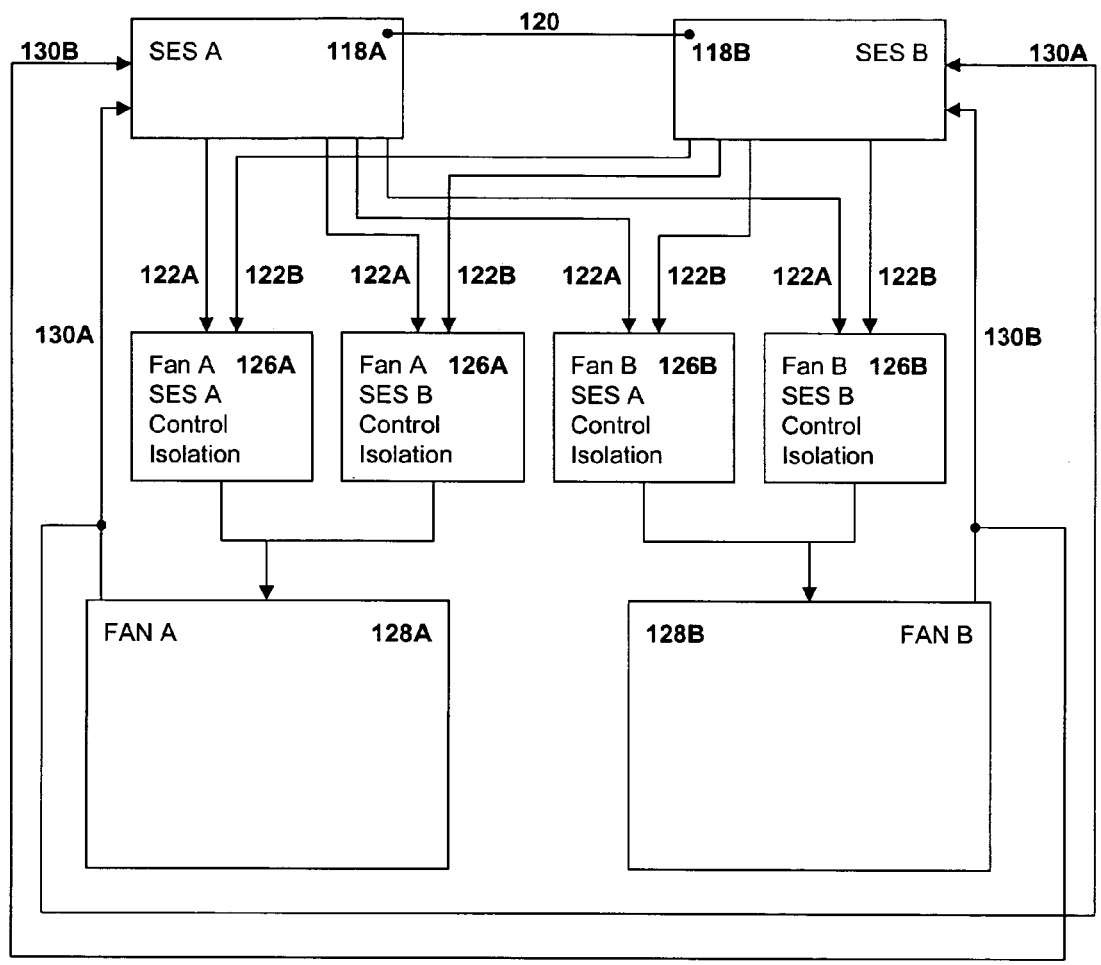
FIG. 2 is a schematic diagram of an embodiment of the present invention featuring two control functions and common input and output paths to the fan elements featuring selective isolation.
FIG. 3 is a block diagram representation of a status table associated with the present invention.

As shown in FIG. 2, isolation units 126A, 126B are interposed on the control signals 122A, 122B between the control functions 118A, 118B and the active cooling devices 128A, 128B associated with each power supply 104A, 104B. The isolation units 126A, 126B can be any type of active switching device known in the computing arts, but will typically be a semiconductor switch using a bipolar transistor or MOSFET to selectively pass or isolate a signal. The active cooling devices 128A, 128B are typically individual fans or banks of multiple fans, but could be blowers, liquid coolant pumps, peltier chips or other active cooling devices known in the computing and data processing arts.

Also as is shown in FIG. 2, feedback signals 130A, 130B are communicated from the fans 128A, 128B to the control functions 118A, 118B. The feedback signals 130A, 130B can be generated by a tachometer associated with each fan 128A, 128B which directly reports fan rotational speed, or by other sensing devices such as Hall effect sensors, continuity sensors or similar devices.

The data processing unit 100 as described above provides for multiple control functions 118A, 118B, each with the capability to drive multiple control signals 122A, 122B. Thus, an intelligent locking mechanism must be implemented to prevent control signal collisions and disruption of the cooling system operation.

Under normal operating conditions, a single control function 118A may be assigned primary responsibility for generating the control signal 122A driving a single fan 128A. The other control function 118B provides both primary control of the other fan 128B and backup or secondary responsibility to take control of the control signal 122A should the primary control function 118A fail or be electively removed from the system. Similarly, the control function 118A provides backup redundant control for fan 128B.

Thus, in the embodiment depicted in FIG. 1 and FIG. 2, the two PWM control signals 122A, 122B can be driven by either control function 118A or 118B. In addition, the feedback signals 130A, 130B can be supplied to either control function 118A, 118B. The control signals 122A, 122B and feedback signals 130A, 130B are logically interconnected such that they provide common input and output paths to the fans 128A, 128B. To ensure proper operation of the fans 128A, 128B, it is critical that there is always one control signal 122A, 122B present, but never more than one. It is typically allowable for brief periods of transition to occur where there is no control signal 122A, 122B present.

For the purposes of this disclosure, control function 118A is the primary control provided for fan 128A and control function 118B is the primary control provided for fan 128B. The control functions 118A, 118B are a clustered pair. As defined herein, a "clustered pair" means that each unit has the independent capability to fulfill all enclosure management functions. Thus, in the event that one of the pair fails or is intentionally withdrawn from the enclosure 102, such as for routine maintenance, the other of the pair detects the failure and assumes control of the missing or failed unit's functions. In order to maintain the primary control/secondary control (master/slave) relationship between the control functions 118A, 118B, it is a requirement that each control function 118A, 118B maintain knowledge of the state of fan ownership.

FIG. 3 illustrates in block diagram form a status table 300 which may be implemented to designate the responsibility of each control function 118A, 118B for the control signal 122A, 122B communicated to each fan unit 128A, 128B.

In the embodiment depicted in FIG. 3, a '1' in the status table 300 indicates that the associated control function 118A, 118B has ownership and responsibility for the given fan control signal 122A, 122B. A '0' conversely indicates that the associated control function 118A, 118B does not maintain ownership of the control signal 122A, 122B. A copy of the status table 300 is maintained in logic associated with each control function 118A, 118B.

One method suitable to transition responsibility for a control signal 122A, 122B from one control function 118A, 118B to the other is to execute a request-grant protocol that is initiated by the control function 118A, 118B that wishes to take ownership of a control input. To take ownership of a control input, a control function 118A, 118B may use inter-control function communication to update the status table 300 associated with each control function 118A, 118B and change the state of the appropriate fan control bit. Commonly used control functions such as the SES control function described above periodically accept data input and provide data output according to a predetermined cycle. This input/output cycle is commonly referred to as a scanloop. During the scanloop of the control function 118A, 118B that is surrendering control, it will be noted that the "requesting" control function 118A, 118B status table 300 has been updated to request ownership of the fan control input. If the relinquishing control function 118A, 118B is not required to maintain control, the relinquishing control function 118A, 118B will update the appropriate bit in the appropriate status table 300 to indicate that control of the given fan 128A, 128B has been transferred.

For example, if it is necessary or desired for control function 118A to take control of fan 128B, control function 118A will set the control status bit of its status table 300 corresponding to fan 128B to a "1". During the next scanloop of control function 118B, it will be noted that the status table 300 associated with control function 118A has changed. Provided that control function 118B is not prohibited from relinquishing control, it will cause the bit of its control status table 300 corresponding to fan 128B to be set to a "0". Control function 118A will observe the change in the status table 300 of control function 118B during the next control function 118A scanloop, confirming the transfer of ownership of fan 128B and control function 118A will accordingly take ownership of fan 128B control signal 122B.

Transfer of control over a fan 128A, 128B pursuant to a request-grant protocol will typically be employed when a component associated with a control function 118A, 118B or a fan 128A, 128B is electively withdrawn from the data processing unit 100 for replacement, routine maintenance, or another reason. The request-grant protocol may be invoked by an operator or, preferably, invoked autonomically when necessary.

An alternative method of transition occurs upon the failure of one control function 118A, 118B. In a failure case, there are at least two methods by which transfer may be initiated. Each control function 118A, 118B can actively sample the feedback signals 130A, 130B associated with each fan 128A, 128B. If the non-primary control function 118A, 118B detects that the speed of a fan 128A, 128B has fallen below a minimum threshold setting, it can be assumed that the peer control function 118A, 118B has failed. The remaining control function 118A, 118B may take ownership of the fan input signal by isolating the failed control function input signal 122A, 122B with isolation units 126A, 126B and drive a control signal 122A, 122B to the fan 128A, 128B. The takeover will also include changing the appropriate status control bits in the status table 300 associated with each control function 118A, 118B.

Another failure case occurs when the presence of a peer control function 118A, 118B is lost. This case may be indicated through a presence detect signal over communication line 120 communicated between the control functions 118A, 118B. Alternatively, inter-control function communication may be lost, or the feedback signal 130A, 130B from a given fan 128A, 128B may show an abnormality. In any of these cases, the surviving control function 118A, 118B may immediately isolate the failing control function 118A, 118B control signal 122A, 122B with isolation units 126A, 126B and take ownership of the control signal 122A, 122B as described above.

Preferably, the control function 118A, 118B remaining after the elective withdrawal of the other control function 118A, 118B or failure of the other control function 118A, 118B will have logic or apparatus associated therewith to detect the return or repair of the withdrawn or failed control function 118A, 118B. For example, the remaining control function 118A, 118B may continue to scan for the return of the status table 300 or inter-control function 118A, 118B communication indicating that the failed or withdrawn control function 118A, 118B has been returned to the system. Preferably, upon return of a failed or withdrawn control function 118A, 118B to the system, the above steps described for transferring control from one control function 118A, 118B to another can be employed to return to the original control function 118A, 118B primary responsibility for any control signal 122A, 122B which it previously owned.

It is important to note that while the present invention has been described in the context of a fully functioning data processing system, those of ordinary skill in the art will appreciated that the processes of the present invention are capable of being distributed in the form of a computer readable medium of instructions and a variety of forms and that the present invention applies regardless of the particular type of signal bearing media actually used to carry out the distribution. Examples of computer readable media include recordable-type media such as a floppy disk, a hard disk drive, a RAM, and CD-ROMs and transmission-type media such as digital and analog communication links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to an apparatus, the need in the art may also be met by a method of cooling system control with clustered management services, a computer program product containing instructions for cooling system control with clustered management services, or a method for deploying computing infrastructure comprising integrating computer readable code into a computing system for cooling system control with clustered management services.

What is claimed is:

1. A data processing unit comprising:
   a first active cooling device configured to respond to a first control signal;
   a second active cooling device configured to respond to a second control signal;
   a first control function selectively capable of providing the first control signal and the second control signal;
   a second control function selectively capable of providing the first control signal and the second control signal; wherein the first and second control functions are in communication with each other;
   means for determining which of the first and second control functions will provide the first control signal at a specific time;
   means for determining which of the first and second control functions will provide the second control signal at a specific time; and
   means for preventing the first and second control functions from providing one of the first and second control signals simultaneously.

2. The data processing unit of claim 1 further comprising:
   means for determining if one of the first and the second control functions has been electively withdrawn from the data processing unit; and
   means for transferring to the remaining control function responsibility for providing any control signal provided by the withdrawn control function prior to the withdrawal.

3. The data processing unit of claim 2 further comprising:
   means for determining if the withdrawn control function has been returned to the data processing unit; and
   means for restoring to the previously withdrawn control function responsibility for providing any control signal provided by it prior to the withdrawal.

4. The data processing unit of claim 1 further comprising:
   means for detecting if one of the first and the second control functions has failed; and
   means for transferring to the remaining control function responsibility for providing any control signal provided by the failed control function prior to the failure.

5. The data processing unit of claim 4 further comprising:
   means for determining if the failed control function has been repaired; and
   means for restoring to the previously failed control function responsibility for providing any control signal provided by it prior to the failure.

6. The data processing unit of claim 1 further comprising first and second status tables associated with the first and second control functions respectively, the status tables having indicators associated therewith, the indicators being capable of indicating which control function is responsible for providing each of the first and second control signals.

7. The data processing unit of claim 1 further comprising:
   a first power supply operatively associated with the first active cooling device; and
   a second power supply operatively associated with the second active cooling device.

8. The data processing unit of claim 7 further comprising:
   a first power control module associated with the first power supply; and
   a second power control module associated with the second power supply, wherein the first and second power control modules receive the first and second control signals respectively and condition the first and second control signals for transmission to the first and second active cooling devices.

9. The data processing unit of claim 1 further comprising:
   a first sensor operatively associated with the first active cooling device, the first sensor being configured to provide a first feedback signal regarding the first active cooling device to the first and second control functions; and
   a second sensor operatively associated with the second active cooling device, the second sensor being configured to provide a second feedback signal regarding the second active cooling device to the first and second control functions.

10. A method of controlling the environment within a data processing unit comprising:
    providing a first control signal from one of a first control function and a second control function to a first active cooling device;
    providing a second control signal from one of the first control function and the second control function to a second active cooling device;
    determining which of the first and second control functions will provide the first control signal at a specific time;
    determining which of the first and second control functions will provide the second control signal at a specific time; and
    preventing the first and second control functions from providing one of the first and second control signals simultaneously.

11. The method of controlling the environment within a data processing unit of claim 10 further comprising:
    determining if one of the first and the second control functions has been electively withdrawn from the data processing unit; and
    transferring to the remaining control function responsibility for providing any control signal provided by the withdrawn control function prior to the withdrawal.

12. The method of controlling the environment within a data processing unit of claim 11 further comprising:
    determining if the withdrawn control function has been returned to the data processing unit; and
    restoring to the previously withdrawn control function responsibility for providing any control signal provided by it prior to the withdrawal.

13. The method of controlling the environment within a data processing unit of claim 10 further comprising:
   detecting if one of the first and the second control functions has failed; and
   transferring to the remaining control function responsibility for providing any control signal provided by the failed control function prior to the failure.

14. The method of controlling the environment within a data processing unit of claim 13 further comprising:
   determining if the failed control function has been repaired; and
   restoring to the previously failed control function responsibility for providing any control signal provided by it prior to the failure.

15. The method of controlling the environment within a data processing unit of claim 10 further comprising associating first and second status tables with the first and second control functions respectively, the status tables having indicators associated therewith, the indicators being capable of indicating which control function is responsible for providing each of the first and second control signals.

16. The method of controlling the environment within a data processing unit of claim 10 further comprising:
   operatively associating a first power supply with the first active cooling device; and
   operatively associating a second power supply with the second active cooling device.

17. The method of controlling the environment within a data processing unit of claim 16 further comprising:
   conditioning the first control signal with a first power control module associated with the first power supply; and
   conditioning the second control signal with a second power control module associated with the second power supply.

18. The method of controlling the environment within a data processing unit of claim 10 further comprising:
   providing feedback to the first and second control functions from a first sensor operatively associated with the first active cooling device; and
   providing feedback to the first and second control functions from a second sensor operatively associated with the second active cooling device.

19. An article of manufacture comprising a tangible computer readable medium for use in programming a data processing unit to control the environment within the data processing unit the article of manufacture comprising instructions for:
   providing a first control signal from one of a first control function and a second control function to a first active cooling device;
   providing a second control signal from one of the first control function and the second control function to a second active cooling device;
   determining which of the first and second control functions will provide the first control signal at a specific time;
   determining which of the first and second control functions will provide the second control signal at a specific time; and
   preventing the first and second control functions from providing one of the first and second control signals simultaneously.

20. The article of manufacture of claim 19 further comprising instructions for:
   determining if one of the first and the second control functions has been electively withdrawn from the data processing unit; and
   transferring to the remaining control function responsibility for providing any control signal provided by the withdrawn control function prior to the withdrawal.

21. The article of manufacture of claim 20 further comprising instructions for:
   determining if the withdrawn control function has been returned to the data processing unit; and
   restoring to the previously withdrawn control function responsibility for providing any control signal provided by it prior to the withdrawal.

22. The article of manufacture of claim 19 further comprising instructions for:
   detecting if one of the first and the second control functions has failed; and
   transferring to the remaining control function responsibility for providing any control signal provided by the failed control function prior to the failure.

23. The article of manufacture of claim 22 further comprising instructions for:
   determining if the failed control function has been repaired; and
   restoring to the previously failed control function responsibility for providing any control signal provided by it prior to the failure.

24. The article of manufacture of claim 19 further comprising instructions for associating first and second status tables with the first and second control functions respectively, the status tables having indicators associated therewith, the indicators being capable of indicating which control function is responsible for providing each of the first and second control signals.

25. The article of manufacture of claim 19 further comprising instructions for:
   operatively associating a first power supply with the first active cooling device; and
   operatively associating a second power supply with the second active cooling device.

26. The article of manufacture of claim 25 further comprising instructions for:
   conditioning the first control signal with a first power control module associated with the first power supply; and
   conditioning the second control signal with a second power control module associated with the second power supply.

27. The article of manufacture of claim 19 further comprising instructions for:
   reacting to feedback from a first sensor operatively associated with the first active cooling device; and
   reacting to feedback from a second sensor operatively associated with the second active cooling device.

28. A method for deploying computing infrastructure, comprising integrating computer readable code into a computing system for controlling the environment within a data processing unit, wherein the code in combination with the computing system is capable of performing the following:
   providing a first control signal from one of a first control function and a second control function to a first active cooling device;
   providing a second control signal from one of the first control function and the second control function to a second active cooling device;

determining which of the first and second control functions will provide the first control signal at a specific time;

determining which of the first and second control functions will provide the second control signal at a specific time; and preventing the first and second control functions from providing one of the first and second control signals simultaneously.

29. The method for deploying computing infrastructure of claim 28 wherein the code in combination with the computing system is further capable of performing the following:

determining if one of the first and the second control functions has been electively withdrawn from the data processing unit; and transferring to the remaining control function responsibility for providing any control signal provided by it prior to the withdrawal.

30. The method for deploying computing infrastructure of claim 29 wherein the code in combination with the computing system is further capable of performing the following:

determining if the withdrawn control function has been returned to the data processing unit; and restoring to the previously withdrawn control function responsibility for providing any control signal provided by it prior to the withdrawal.

31. The method for deploying computing infrastructure of claim 28 wherein the code in combination with the computing system is further capable of performing the following:

detecting if one of the first and the second control functions has failed; and transferring to the remaining control function responsibility for providing any control signal provided by it prior to the failure.

32. The method for deploying computing infrastructure of claim 31 wherein the code in combination with the computing system is further capable of performing the following:

determining if the failed control function has been repaired; and restoring to the previously failed control function responsibility for providing any control signal provided by it prior to the failure.

33. The method for deploying computing infrastructure of claim 28 wherein the code in combination with the computing system is further capable of associating first and second status tables with the first and second control functions respectively, the status tables having indicators associated therewith, the indicators being capable of indicating which control function is responsible for providing each of the first and second control signals.

34. The method for deploying computing infrastructure of claim 28 wherein the code in combination with the computing system is further capable of performing the following:

operatively associating a first power supply with the first active cooling device; and operatively associating a second power supply with the second active cooling device.

35. The method for deploying computing infrastructure of claim 34 wherein the code in combination with the computing system is further capable of performing the following:

conditioning the first control signal with a first power control module associated with the first power supply; and conditioning the second control signal with a second power control module associated with the second power supply.

36. The method for deploying computing infrastructure of claim 28 wherein the code in combination with the computing system is further capable of performing the following:

reacting to feedback from a first sensor operatively associated with the first active cooling device; and reacting to feedback from a second sensor operatively associated with the second active cooling device.

* * * * *